United States Patent
Lin

(10) Patent No.: US 11,994,553 B2
(45) Date of Patent: May 28, 2024

(54) SIGNAL TRANSMISSION CIRCUIT AND METHOD, AND INTEGRATED CIRCUIT (IC)

(71) Applicant: Changxin Memory Technologies, Inc., Anhui (CN)

(72) Inventor: You-Hsien Lin, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 491 days.

(21) Appl. No.: 17/324,995

(22) Filed: May 19, 2021

(65) Prior Publication Data
US 2021/0270889 A1 Sep. 2, 2021

Related U.S. Application Data

(63) Continuation of application No. PCT/CN2019/118465, filed on Nov. 14, 2019.

(30) Foreign Application Priority Data

Nov. 28, 2018 (CN) .......................... 201811434151.2
Nov. 28, 2018 (CN) .......................... 201822026617.7

(51) Int. Cl.
*G01R 31/28* (2006.01)
*H03K 3/037* (2006.01)
(Continued)

(52) U.S. Cl.
CPC ......... *G01R 31/2889* (2013.01); *H03K 3/037* (2013.01); *H03K 17/6871* (2013.01); *H03K 19/02* (2013.01)

(58) Field of Classification Search
CPC ....... H01L 25/0657; H01L 2225/06541; H01L 2225/06596; G01R 31/318513; G01R 31/318563
See application file for complete search history.

(56) References Cited

U.S. PATENT DOCUMENTS 9,432,298 B1 * 8/2016 Smith ................ H04L 49/9057
9,829,537 B2 11/2017 Kim et al.
(Continued)

FOREIGN PATENT DOCUMENTS

CN 107045894 A 8/2017
CN 209045539 U 6/2019

OTHER PUBLICATIONS

PCT International Search Report and the Written Opinion dated Feb. 26, 2020, issued in related International Application No. PCT/CN2019/118465 (7 pages).

*Primary Examiner* — Jermele M Hollington
*Assistant Examiner* — Temilade S Rhodes-Vivour
(74) *Attorney, Agent, or Firm* — Sheppard Mullin Richter & Hampton LLP

(57) ABSTRACT

A signal transmission circuit and method for testing an integrated circuit (IC) are disclosed. The signal transmission circuit includes: an input circuit, configured to generate a first test signal in response to a first control signal and a clock signal; a transfer chain, including multiple stages of serially-connected transfer circuits, where adjacent transfer circuits in the transfer chain are connected via a through silicon via (TSV), the transfer circuit on one end of the transfer chain is connected to the input circuit, and the multiple stages of transfer circuits transfer the first test signal in stage by stage in response to the clock signal; and multiple signal output ends, where a first test signal input end of each stage of transfer circuit is correspondingly connected to one signal output end. The signal transmission circuit improves the effective utilization rate of a chip in an IC having a TSV test circuit.

19 Claims, 6 Drawing Sheets

(51) Int. Cl.
*H03K 17/687* (2006.01)
*H03K 19/02* (2006.01)

(56) References Cited

U.S. PATENT DOCUMENTS

| | | | |
|---|---|---|---|
| 2011/0026293 A1* | 2/2011 | Riho | H01L 25/18 |
| | | | 365/63 |
| 2011/0069523 A1* | 3/2011 | Kuroda | G11C 7/1006 |
| | | | 365/230.03 |
| 2011/0092030 A1* | 4/2011 | Or-Bach | H10B 10/00 |
| | | | 438/129 |
| 2012/0110402 A1* | 5/2012 | Wang | G01R 31/318558 |
| | | | 714/E11.155 |
| 2013/0275798 A1* | 10/2013 | Kondo | G06F 1/04 |
| | | | 713/500 |
| 2017/0103930 A1 | 4/2017 | Lee | |

* cited by examiner

SIGNAL TRANSMISSION CIRCUIT AND METHOD, AND INTEGRATED CIRCUIT (IC)

CROSS-REFERENCE TO RELATED APPLICATIONS

This application is a continuation application of International Patent Application No. PCT/CN2019/118465, filed on Nov. 14, 2019, which is based on and claims priority to and benefits of the Chinese Patent Applications No. 201811434151.2 and No. 201822026617.7, both filed with the China National Intellectual Property Administration (CNIPA) of the People's Republic of China on Nov. 28, 2018. The entire content of the above-referenced applications is incorporated herein by reference.

TECHNICAL FIELD

The present disclosure relates to the technical field of integrated circuit (IC) chips, and in particular to a signal transmission circuit and method for testing an integrated circuit (IC).

BACKGROUND

With the development in electronic technologies, three-dimensional (3D) ICs are widely adopted. Chip layers in the 3D ICs are connected via through silicon vias (TSVs). In order to guarantee the reliability of the 3D ICs, it is necessary to test the connectivity of the TSVs.

When the connectivity of the TSVs in the 3D ICs is tested, a test signal is often provided for each chip layer. In the related art, multiple TSVs are disposed in a 3D IC, and the test signal is provided for each chip layer via the multiple TSVs. As a great number of test TSVs are provided in the 3D IC, the effective utilization rate of the chip is reduced.

It is to be noted that the information disclosed in the above Background is merely for strengthening the understanding on the background of the present disclosure and thus may include information not constituted into prior art known to a person of ordinary skill in the art.

SUMMARY

The present disclosure provides a signal transmission circuit and method for testing an IC, by providing signals for a TSV test circuit, thereby overcoming the problem of a low effective utilization of a chip due to a great number of test TSVs required by the TSV test circuit to transfer the signals in the related art.

One first aspect of the present disclosure may direct to a signal transmission circuit configured for testing an integrated circuit (IC), including: an input circuit configured to generate a first test signal in response to a first control signal and a clock signal, a transfer chain comprising multiple stages of serially-connected transfer circuits, and multiple signal output ports, wherein a first test signal input port of each stage of transfer circuit is correspondingly connected to one of the multiple signal output ports. The adjacent two stages of transfer circuits in the transfer chain may be connected via a through silicon via (TSV) therebetween, a transfer circuit on one end of the transfer chain may be connected to the input circuit, and the multiple stages of transfer circuits may transfer the first test signal stage by stage in response to the clock signal.

According to an embodiment of the present disclosure, the input circuit may include a first Flip-Flop comprising an input pin connected to the first control signal and a clock pin connected to the clock signal, and an AND gate comprising a first input pin connected to the first control signal and a second input pin connected to an inverted output pin of the first Flip-Flop.

According to an embodiment of the present disclosure, the transfer circuit may include a second Flip-Flop comprising an input pin connected to the first test signal and a clock pin connected to the clock signal, and a third Flip-Flop comprising an input pin connected to an output pin of the second Flip-Flop and a clock pin connected to the clock signal.

According to an embodiment of the present disclosure, the adjacent two stages of transfer circuits in the transfer chain may be connected via the TSV, the output pin of the third Flip-Flop of one stage of transfer circuit may be connected to a first end of the TSV, and the input pin of the second Flip-Flop of another stage of transfer circuit may be connected to a second end of the TSV.

According to an embodiment of the present disclosure, the input circuit may be disposed on a base chip layer of an integrated circuit (IC), and the multiple stages of transfer circuits may be respectively disposed in each chip layer of the IC.

According to an embodiment of the present disclosure, the signal transmission circuit may further include a first test TSV chain comprising multiple serially-connected TSVs and configured to transmit the first control signal from a top chip layer to the base chip layer.

According to an embodiment of the present disclosure, the signal transmission circuit may further include a mode selection circuit comprising a first input port connected to the first test signal, a second input port connected to a second test signal, a control port connected to the first control signal, a first output port connected to an input port of a stage of the transfer circuit and configured to transmit the first test signal to the input port of the stage of transfer circuit under the control of the first control signal, and a second output port connected to an output port of the stage of transfer circuit and configured to transmit the second test signal to the output port of the stage of transfer circuit under the control of the first control signal. The first test signal and the second test signal may be transmitted to adjacent chip layers via a same TSV, and the second test signal may be connected to the multiple signal output ports.

According to an embodiment of the present disclosure, the mode selection circuit may include a first switch comprising a first pin connected to the output port of the input circuit, a second pin connected to the input port of the stage of transfer circuit, and a control pin connected to the first control signal. The mode selection circuit may include a second switch comprising a first pin connected to the second test signal, a second pin connected to the output port of the stage of transfer circuit, and a control pin connected to the first control signal.

According to an embodiment of the present disclosure, the first switch may include an N-type metal-oxide-semiconductor field effect transistor (MOSFET), and the second switch may include a P-type MOSFET.

According to an embodiment of the present disclosure, the mode selection circuit may include a first inverter comprising an input pin connected to the first control signal, a second inverter comprising an input pin connected to an output pin of the first inverter, a first switch comprising a first pin connected to the first test signal, a second pin connected to the input port of the stage of transfer circuit, a first control pin connected to the output pin of the first inverter, and a second control pin connected to an output end of the second inverter, and a second switch comprising a first pin connected to the second test signal, a second pin connected to the output ports of the stage of transfer circuit, a first control pin connected to the output pin of the second inverter, and a second control pin connected to the output pin of the first inverter. The first switch and the second switch may be complementary metal oxide semiconductor (CMOS) transmission gates.

According to an embodiment of the present disclosure, the multiple stages of mode selection circuits may be respectively disposed in each chip layer of the IC.

According to an embodiment of the present disclosure, the signal transmission circuit may further include a second test TSV chain, comprising multiple serially-connected TSVs and configured to provide the first control signal for the multiple stages of mode selection circuits.

A second aspect of the present disclosure may direct to an integrated circuit (IC) testing method, configured for a signal transmission circuit, including: outputting, by an input circuit, a first test signal to an input port of a first stage of transfer circuit in a transfer chain in response to a first control signal and a clock signal, wherein the first stage of transfer circuit is a transfer circuit in the transfer chain connected to the input circuit; sequentially transmitting, by multiple stages of transfer circuits, the first test signal along the transfer chain in response to the clock signal; and when the first test signal is transmitted to an output port of a stage of transfer circuit, outputting, by a signal output port connected to an input port of the transfer circuit, the first test signal to a chip layer of the IC.

According to an embodiment of the present disclosure, outputting, by the input circuit, the first test signal to the input port of the first stage of transfer circuit in the transfer chain in response to the first control signal and the clock signal may comprise outputting the first test signal to the input port of the first stage of transfer circuit in the transfer chain when the first control signal is high.

According to an embodiment of the present disclosure, sequentially transmitting, by the multiple stages of transfer circuits, the first test signal along the transfer chain in response to the clock signal may comprise transmitting the first test signal from a previous stage of transfer circuit to a current stage of transfer circuit according to the clock signal when the first control signal is high, wherein the first test signal at an output of the current stage of transfer circuit is delayed by at least one clock cycle from the first test signal at an output of the previous stage of transfer circuit.

According to an embodiment of the present disclosure, the IC testing method may further include transmitting a second test signal to signal output ports at a plurality of chip layers in the IC when the first control signal is low.

According to an embodiment of the present disclosure, the IC testing method may further include selectively outputting, by a mode selection circuit, the first test signal sequentially to the plurality of chip layers in the IC or the second test signal simultaneously to the plurality of chip layers in the IC, according to the first control signal.

According to an embodiment of the present disclosure, the IC testing method may further include transmitting the first control signal from a top chip layer of the IC to a base chip layer of the IC by a first test TSV chain, wherein the first test TSV chain comprises multiple serially-connected TSVs.

According to an embodiment of the present disclosure, the first test signal may have a pulse width of one clock cycle.

A third aspect of the present disclosure may direct to an IC, including the above-mentioned signal transmission circuit.

According to the signal transmission circuit provided by the present disclosure, an input circuit generates a first test signal in response to a first control signal and a clock signal, the first test signal is transferred stage by stage via multiple stages of transfer circuits, and the first test signal is output to multiple chip layers via multiple signal output ports connected to input ports of the multiple stages of transfer circuits. The test signal is provided for a TSV test circuit layer by layer, the connectivity of TSVs is tested conveniently layer by layer with a simple structured circuit. Therefore, the problems of a low effective area of a chip and a low utilization rate of the chip due to a great number of test TSVs for transmitting the test signals in the related art are prevented.

It is to be understood that both the foregoing general description and the following detailed description are exemplary and explanatory only and are not necessarily restrictive to the present disclosure.

BRIEF DESCRIPTION OF DRAWINGS

The exemplary embodiments are described in detail with reference to the accompanying drawings, so that the above and other characteristics and advantages of the present disclosure become more apparent.

Figure 1:
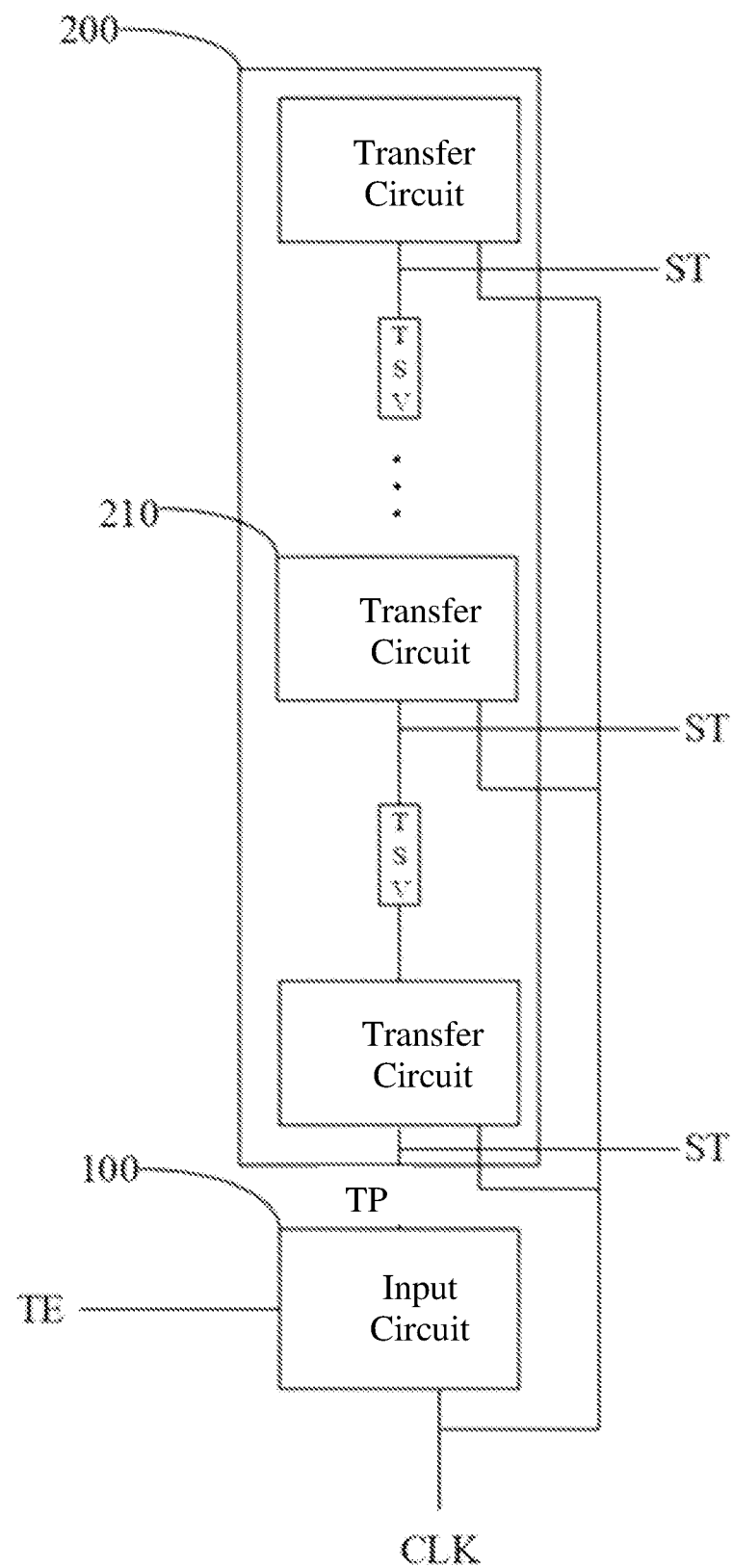
FIG. 1 is a schematic diagram of a signal transmission circuit provided by an embodiment of the present disclosure.

NUMERALS IN THE FIGURES 100, input circuit;
101, first Flip-Flop;
102, AND gate;
200, transfer chain;
210, transfer circuit;
211, second Flip-Flop;
212, third Flip-Flop;
300, mode selection circuit;
310, first switch;
320, second switch;
311, first inverter;
321, second inverter;
TE, first control signal;
TP, first test signal;
TF, second test signal;
CLK, clock signal;

RST, reset signal;
ST, signal output port; and
DTP, transferred first test signal.

DESCRIPTION OF EMBODIMENTS

The exemplary embodiments will be described more completely in conjunction with the accompanying drawings. However, the exemplary embodiments can be implemented in various forms, and should not be understood as being limited to the embodiments described herein. Instead, these embodiments are provided to make the present disclosure thorough and complete and convey the concepts of the exemplary embodiments to the person skilled in the art fully. Identical numerals in the drawings represent identical or similar structures and thus the detailed descriptions thereof are omitted.

In addition, the described characteristics, structures, or properties may be combined in one or more embodiments in any appropriate manner. In the following description, many particular details are provided to give a full understanding on the embodiments of the present disclosure. However, it would be appreciated by the person skilled in the art that one or more of the particular details may be omitted by the practice of the technical solutions of the present disclosure, or other methods, components, apparatuses, steps, and the like may be adopted. In other cases, the known technical solutions are not illustrated or described in detail to prevent distracting and making aspects of the present disclosure obscure.

The block diagrams in the accompanying drawings are functional entities, which do not necessarily correspond to independent physical entities. That is, these functional entities may be implemented in a software form, or these functional entities or a part of these functional entities are implemented in one or more modules combining software and hardware, or these functional entities are implemented in different networks and/or processor apparatuses and/or microcontroller apparatuses.

In the related art, TSVs in a 3D IC are configured to connect multiple chip layers. In order to guarantee the connectivity of the multiple chip layers, the TSVs need to be tested. In the TSV testing, for accurately locating the position of a faulty TSV, the TSVs are often tested layer by layer, and test signals are provided layer by layer. The signal transmission circuit provided by embodiments of the present disclosure can implement the function of providing the test signals layer by layer.

As shown in FIG. 1, the signal transmission circuit provided by the embodiment of the present disclosure may include an input circuit 100, a transfer chain 200, and multiple signal output ports ST. The input circuit 100 is configured to generate a first test signal TP in response to a first control signal TE and a clock signal. The transfer chain 200 includes multiple stages of serially-connected transfer circuits 210. Adjacent transfer circuits 210 in the transfer chain 200 are connected via a TSV. The transfer circuit 210 on one end of the transfer chain 200 is connected to the input circuit 100, and the multiple stages of transfer circuits 210 transfer the first test signal TP stage by stage in response to the clock signal. The input of the first test signal TP of each stage of transfer circuit 210 is correspondingly connected to one signal output port ST, and each signal output port ST is configured to provide a test signal for a chip layer.

According to the signal transmission circuit provided by this embodiment of the present disclosure, an input circuit 100 may generate a first test signal TP in response to a first control signal TE and a clock signal. The first test signal TP is transferred stage by stage via multiple stages of transfer circuits 210, and the first test signal TP is output to multiple chip layers layer by layer via multiple signal output ports ST connected to the input ports of the multiple stages of transfer circuits 210. The test signals may be provided to a TSV test circuit layer by layer, to facilitate the layer by layer connectivity test of the TSVs with a simple circuit structure. Therefore, the problems of a low effective area and a low utilization of the chip due to a great number of test TSVs for transmitting the test signals in the related art are prevented.

The signal transmission circuit provided by the embodiment of the present disclosure will be described below in detail.

Figure 2:
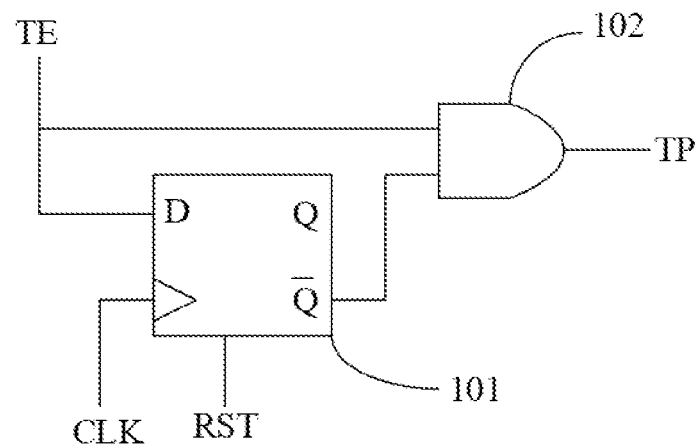
FIG. 2 is a schematic diagram of an input circuit provided by an embodiment of the present disclosure.

As shown in FIG. 2, the input circuit 100 may include a first Flip-Flop 101 and an AND gate 102. The first Flip-Flop 101 includes an input pin connected to the first control signal TE, and a clock pin connected to the clock signal. The AND gate 102 includes a first input pin connected to the first control signal TE, and a second input pin connected to an inverted output pin of the first Flip-Flop 101.

Figure 3:
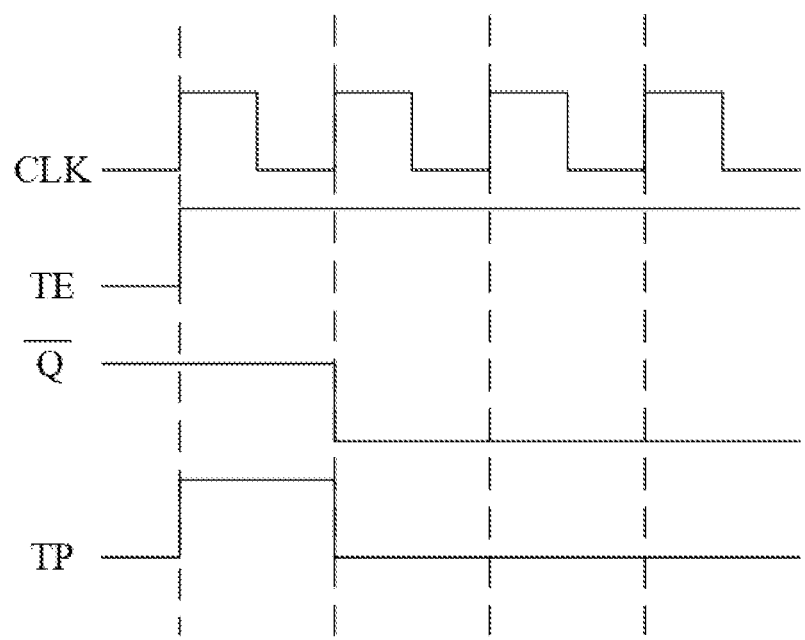
FIG. 3 is a time diagram of an input signal and an output signal of an input circuit provided by an embodiment of the present disclosure.

The first Flip-Flop 101 may be a D Flip-Flop, and the inverted output pin of the first Flip-Flop 101 is a $\overline{Q}$ end. Timing of the first control signal TE, clock signal, first Flip-Flop signal, and first test signal TP are shown in FIG. 3. If the D pin of the D Flip-Flop inputs the first control signal TE and the clock pin inputs the clock signal, the $\overline{Q}$ pin outputs the first Flip-Flop signal. The first D Flip-Flop signal and the first control signal TE generate the first test signal TP through the AND gate 102.

Figure 4:
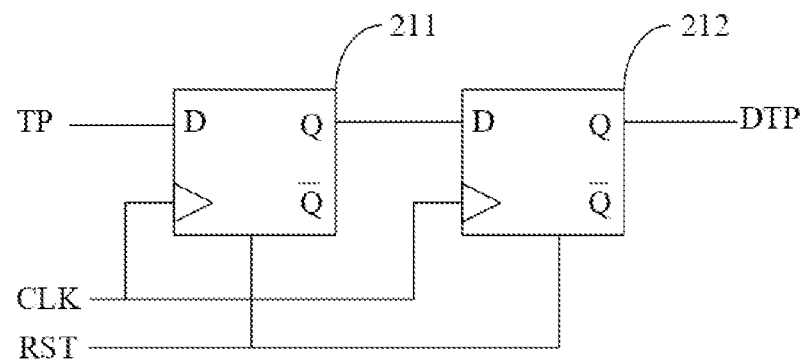
FIG. 4 is a schematic diagram of a transfer circuit provided by an embodiment of the present disclosure.

As shown in FIG. 4, the transfer circuit 210 may include a second Flip-Flop 211 and a third Flip-Flop 212. The second Flip-Flop 211 includes an input pin connected to the first test signal TP and a clock pin connected to the clock signal. The third Flip-Flop 212 may include an input pin connected to an output pin of the second Flip-Flop 211 and a clock pin connected to the clock signal.

Figure 5:
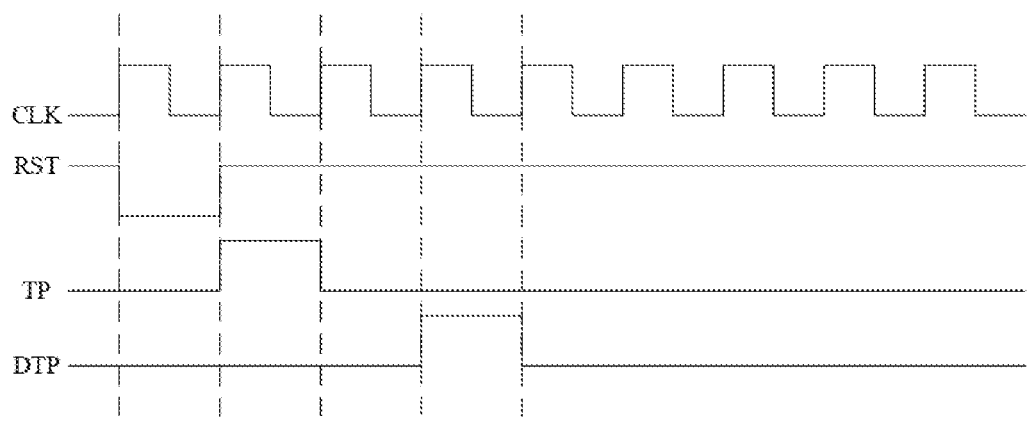
FIG. 5 is a time diagram of an input signal and an output signal of a transfer circuit provided by an embodiment of the present disclosure.

The second Flip-Flop 211 and the third Flip-Flop 212 may be the D Flip-Flops. Before the first test signal TP is input to the second Flip-Flop 211, the second Flip-Flop 211 and the third Flip-Flop 212 may be reset via a reset signal RST. The timing of the clock signal, reset signal RST, first test signal TP input to the transfer circuits 210, and first test signal TP output by the transfer circuits 210 are shown in FIG. 5. The first test signal TP is input to the second Flip-Flop 211 to shift one clock cycle, and the first test signal TP output by the second Flip-Flop 211 is shifted by another clock cycle by the third Flip-Flop 212.

Adjacent two stages of transfer circuits 210 in the transfer chain 200 may be connected via a TSV. An output pin of the third Flip-Flop 212 of a previous stage of transfer circuit 210 is connected to a first end of the TSV, and an input pin of the second Flip-Flop 211 of a later stage of transfer circuit 210 is connected to a second end of the TSV. The two stages of transfer circuits 210 are sequenced according to a flow direction of the signal. The transfer circuit 210 to which the first test signal TP flows in first is the previous stage of transfer circuit 210.

It is to be noted that at least one Flip-Flop may be provided in each transfer circuit 210. For example, each transfer circuit 210 may include one second Flip-Flop 211, and the second Flip-Flop 211 has the input pin connected to the first test signal TP and the output pin connected to the TSV. Or each transfer circuit 210 may include the above second Flip-Flop 211 and third Flip-Flop 212. Certainly, each transfer circuit 210 may also include multiple Flip-Flops, and the multiple Flip-Flops are serially connected and transfer the first test signal TP in sequence, which is not specifically disclosed thereto by this embodiment of the present disclosure.

The input circuit 100 may be disposed on a base chip layer of an IC, and the transfer circuits 210 may be respectively disposed in each chip layer of the IC. For example, the IC includes N chip layers, the input circuit 100 is located in the base chip layer and the base chip layer is recorded as a first layer. Similarly, the multiple stages of transfer circuits may also be named accordingly, that is, the transfer circuit 210 located on a bottommost layer is a first stage of transfer circuit, and that located on a topmost layer is a Nth stage of transfer circuit. Each layer in the N chip layers may be provided with one stage of transfer circuit 210 and one signal output port ST. The first test signal TP output by an input circuit is transferred layer by layer via the stages of transfer circuits 210 and the TSVs between the stages of transfer circuits 210, for providing the test signals for the TSV test circuit layer by layer. The test signal is transferred in sequence according to an order from the first layer to the Nth layer.

Certainly, in actual applications, the input circuit 100 may also be disposed in a top chip layer. As such, the first test signal TP may be transmitted layer by layer from the top chip layer to the bottom chip layer, which is not specifically defined thereto by this embodiment of the present disclosure.

Usually, in the actual applications, a first control signal TE generation apparatus cannot be directly disposed on the base chip layer. In order to transmit the first control signal TE to the input circuit 100 located in the base chip layer, the signal transmission circuit may further include a first test TSV chain, wherein the first test TSV chain may include multiple serially-connected TSVs, and be configured to transmit the first control signal TE from the top chip layer to the base chip layer. The first test TSV chain includes an upper end connected to the first control signal TE and a lower end connected to the input circuit 100.

Further, in order to meet the requirement that the TSV test circuit can test the whole TSV chain at a time, the signal transmission circuit may further include a mode selection circuit 300. The mode selection circuit 300 may include a first input port connected to the first test signal TP, a second input port connected to a second test signal TF, and a control port connected to the first control signal TE. A first output port of the mode selection circuit 300 is connected to input ports of the transfer circuits 210 and configured to transmit the first test signal TP to the input ports of the transfer circuits 210 under the control of the first control signal TE. A second output port of the mode selection circuit 300 is connected to output ports of the transfer circuits 210 and configured to transmit the second test signal TF to the output ports of the transfer circuits 210 under the control of the first control signal TE. The first test signal TP and the second test signal TF are transmitted to an adjacent chip layer via a same TSV, and the second test signal is respectively connected to the multiple signal output ports ST.

It is to be noted that, for the mode selection circuit 300 disposed on the base chip layer, the first test signal TP is a first test signal output by the input circuit. For the mode selection circuit 300 disposed on the chip layer other than the base layer, the first test signal and the second test signal are a first test signal TP and a second test signal TF transmitted via the TSV from a lower chip layer to the current chip layer.

With the mode selection circuit, a working mode of transmitting the test signal layer by layer or a working mode of transmitting the test signal to multiple layers simultaneously may be implemented, so that the signal transmission circuit is more flexible and can be adapted for more application scenarios.

Figure 6:
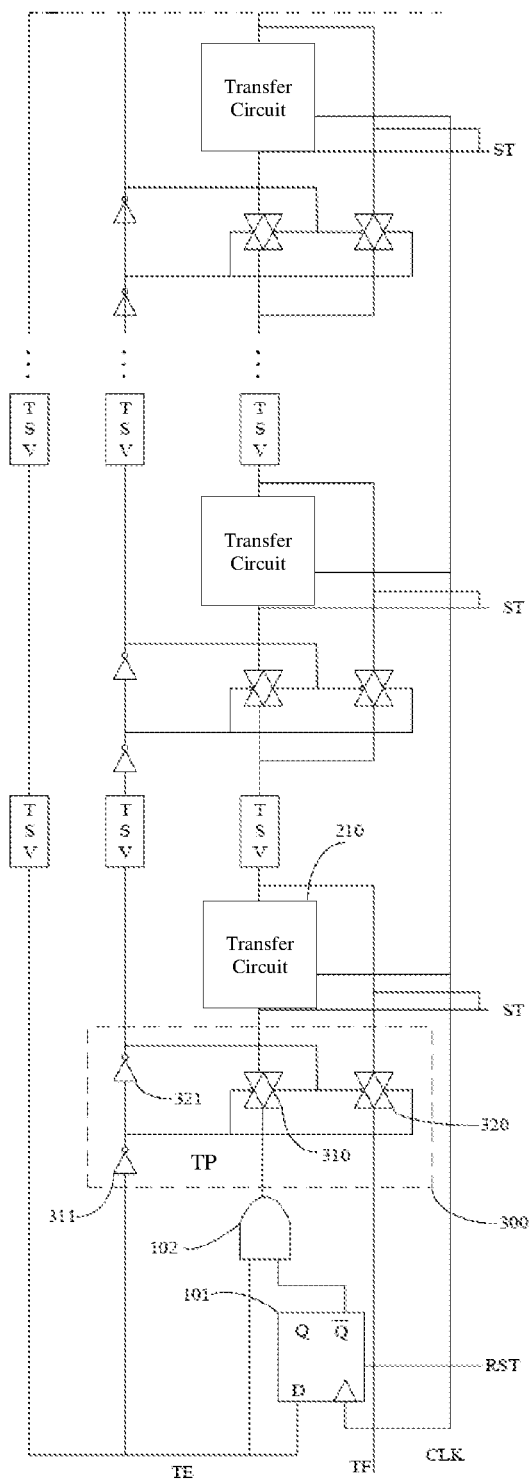
FIG. 6 is a schematic diagram of a signal transmission circuit provided by an embodiment of the present disclosure.

As shown in FIG. 6, the mode selection circuit 300 includes a first switch 310 and a second switch 320. The first switch 310 includes a first pin connected to the output port of the input circuit 100, a second pin connected to the input pins of the transfer circuits 210, and a control pin connected to the first control signal TE. The second switch 320 includes a first pin connected to the second test signal TF, a second pin connected to the output pins of the transfer circuits 210, and a control pin connected to the first control signal TE.

In a feasible implementation manner provided by one embodiment of the present disclosure, the first switch 310 is an NMOS, including a first pin connected to the output pin of the input circuit, a second pin connected to the input pins of the transfer circuits 210, and a control pin connected to the first control signal TE. The second switch 320 is a PMOS, including a first pin connected to the second test signal TF, a second pin connected to one end of the TSV, and the control pin connected to the first control signal TE. When the first control signal TE is high, the first switch 310 is on, the second switch 320 is off, and a first output port of the mode selection circuit 300 outputs the first test signal TP layer by layer. When the first control signal TE is low, the first switch 310 is off, the second switch 320 is on, and a second output port of the mode selection circuit 300 outputs the second test signal TF simultaneously to all chip layers.

In another feasible implementation manner provided by one embodiment of the present disclosure, the mode selection circuit 300 may include a first inverter 311, a second inverter 321, the first switch 310, and the second switch 320. An input pin of the first inverter 311 is connected to the first control signal TE, and an input pin of the second inverter 321 is connected to an output pin of the first inverter 311. The first switch 310 includes a first pin connected to the first test signal TP, a second pin connected to the input pins of the transfer circuits, a first control pin connected to the output pin of the first inverter 311, and a second control pin connected to an output pin of the second inverter 321. The second switch 320 includes a first pin connected to the second test signal TF, a second pin connected to the output pins of the transfer circuits 210, a first control pin connected to the output pin of the second inverter 321 and a second control pin connected to the output pin of the first inverter 311. In this way, only one of the first switch 310 and the second switch 320 may be turned on. The first switch 310 and the second switch 320 are CMOS transmission gates.

In one embodiment of the present disclosure, the signal transmission circuit may include multiple stages of mode selection circuits 300. Each stage of transfer circuit 210 is correspondingly coupled to one stage of mode selection circuits 300. A second output port of a previous stage mode selection circuit 300 among two adjacent mode selection circuits 300 is connected to a second input port of a later stage mode selection circuit 300 via the TSV. For example, the mode selection circuit 300 in the base chip layer includes a first input port connected to the output port of the input circuit 100, a second input port connected to the second test signal TF, a first output port connected to the input port of the transfer circuit 210 in the same layer and a second output port connected to the output port of the transfer circuit 210 in the same layer. First input ports and second input ports of the mode selection circuits 300 in chip layers above the base chip layer are connected to lower TSVs, and each lower TSV is a TSV for connecting the lower chip layer to the current chip layer.

Further, in order to provide the first control signal TE for the mode selection circuits in the chip layers, the signal transmission circuit provided by this embodiment of the present disclosure may further include a second test TSV chain, including multiple serially-connected TSVs and configured to provide the first control signal TE for the multiple stages of mode selection circuits 300.

Figure 7:
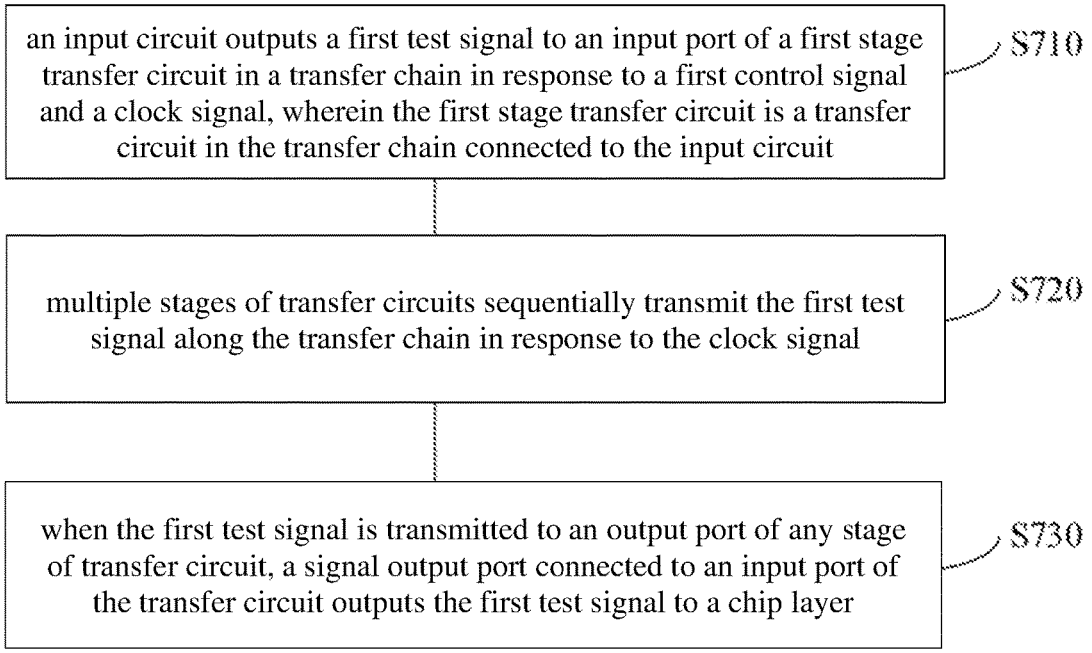
FIG. 7 is a flowchart of a signal transmission method provided by an embodiment of the present disclosure.

An embodiment of the present disclosure may further provide a signal transmission method, configured for the above signal transmission circuit. As shown in FIG. 7, the signal transmission method may include the following steps.

In Step S710, an input circuit 100 outputs a first test signal TP to an input port of a first stage transfer circuit 210 in a transfer chain 200 in response to a first control signal TE and a clock signal. The first stage transfer circuit 210 is a transfer circuit 210 in the transfer chain 200 connected to the input circuit 100.

In Step S720, multiple stages of transfer circuits 210 sequentially transmit the first test signal TP along the transfer chain 200 in response to the clock signal.

In Step S730, when the first test signal TP is transmitted to an output port of any stage of transfer circuit 210, a signal output port ST connected to an input port of the transfer circuit 210 outputs the first test signal TP to a chip layer.

According to the signal transmission method provided by this embodiment of the present disclosure, an input circuit 100 outputs a first test signal TP to an input port of a first stage of transfer circuit 210 in a transfer chain 200 in response to a first control signal TE and a clock signal, and multiple stages of transfer circuits 210 sequentially transmit the first test signal TP along the transfer chain 200 in response to the clock signal. When the first test signal TP is transmitted to an output port of any stage of transfer circuits 210, a signal output port ST connected to an input port of the transfer circuit 210 outputs the first test signal TP. The test signal is transmitted to multiple chip layers layer by layer using a simple structured circuit, resulting in an improved effective utilization rate of a chip and reduced cost.

Figure 8:
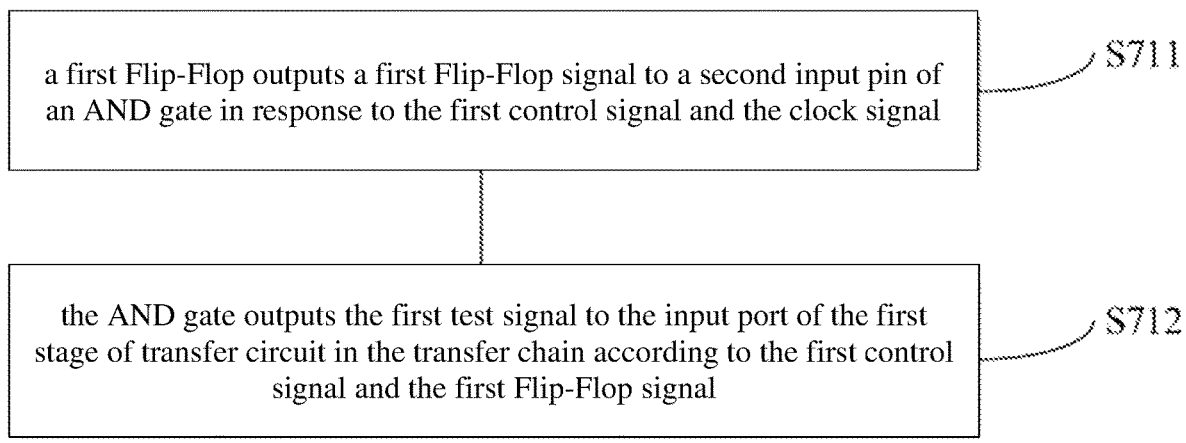
FIG. 8 is a flowchart of a signal transmission method provided by another embodiment of the present disclosure.

As shown in FIG. 8, when the input circuit 100 includes a first Flip-Flop 101 and an AND gate 102, the first Flip-Flop 101 includes an input pin connected to the first control signal TE, and a clock pin connected to the clock signal. The AND gate 102 includes a first input pin connected to the first control signal TE, and a second input pin connected to an inverted output pin of the first Flip-Flop 101, the step S710 includes the following steps.

In Step S711, a first Flip-Flop 101 outputs a first Flip-Flop signal to a second input pin of an AND gate 102 in response to the first control signal TE and the clock signal.

In Step S712, the AND gate 102 outputs the first test signal TP to the input port of the first stage of transfer circuit 210 in the transfer chain 200 according to the first control signal TE and the first Flip-Flop signal.

Figure 9:
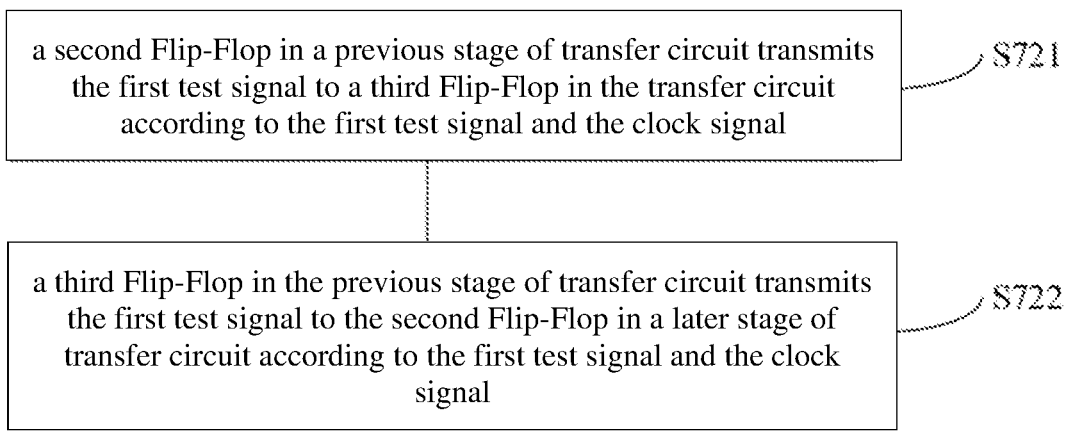
FIG. 9 is a flowchart of a signal transmission method provided by another embodiment of the present disclosure.

As shown in FIG. 9, when the transfer circuit 210 includes a second Flip-Flop 211 and a third Flip-Flop 212, the second Flip-Flop 211 includes an input pin connected to the first test signal TP and a clock pin connected to the clock signal, and the third Flip-Flop 212 includes an input pin connected to an output pin of the second Flip-Flop 211 and a clock pin connected to the clock signal, the step S720 may include the following steps.

In Step S721, a second Flip-Flop 211 in a previous stage of transfer circuit 210 transmits the first test signal TP to a third Flip-Flop 212 in the transfer circuit 210 according to the first test signal TP and the clock signal.

In Step S722, the third Flip-Flop 212 in the previous stage of transfer circuit 210 transmits the first test signal TP to the second Flip-Flop 211 in a later stage of transfer circuit 210 according to the first test signal TP and the clock signal.

The previous stage of transfer circuit 210 and the later stage of transfer circuit 210 are two adjacent transfer circuits 210. The transfer circuit 210 to which the first test signal TP flows first is the previous stage of transfer circuit 210.

Further, the signal transmission circuit may include a mode selection circuit 300. The mode selection circuit 300 includes a first input port connected to the first test signal TP, a second input port connected to a second test signal TF, and a control port connected to the first control signal TE. A first output port is connected to input ports of the transfer circuits 210 and configured to transmit the first test signal TP to the input ports of the transfer circuits 210 under the control of the first control signal TE. A second output port is connected to output ports of the transfer circuits 210 and configured to transmit the second test signal TF to the output ports of the transfer circuits 210 under the control of the first control signal TE. At this time, the signal transmission method may further include the following steps.

In Step S740, a mode selection circuit selectively outputs the first test signal TP or the second test signal TF according to the first control signal TE.

When the first control signal TE is high, the first switch 310 is on, the second switch 320 is off, and a first output port of the mode selection circuit 300 outputs the first test signal TP layer by layer. When the first control signal TE is low, the first switch 310 is off, the second switch 320 is on, and a second output port of the mode selection circuit 300 outputs the second test signal TF simultaneously to all chip layers.

An embodiment of the present disclosure further provides an IC, including the above-mentioned signal transmission circuit. Certainly, the apparatus may further include a TSV test circuit, capacitors, resistors, and other components in implementations, which are not described herein by this embodiment of the present disclosure.

It is to be noted that the steps of the method in the present disclosure are described in a particular sequence in the accompanying drawings, but this does not require or imply that these steps must be executed according to the particular sequence, or all shown steps must be executed completely to implement an expected result. Additionally or alternatively, it may be appropriate to omit some steps, combine multiple steps into one step for execution, and/or split one step into multiple steps for execution, etc.

Besides, the above accompanying drawings are merely illustrative descriptions of the steps included in the method according to the embodiment of the present disclosure rather than limitations. It is easily understood that the steps illustrated in the above accompanying drawings do not indicate or limit a time sequence of these steps. In addition, it is also easily understood that these steps may be, for example, executed in multiple modules synchronously or asynchronously.

Other embodiments of the present disclosure will be apparent to the person skilled in the art from consideration of the specification and practice of the present disclosure disclosed here. The present disclosure covers any variations, uses, or adaptations of the present disclosure following the general principles thereof and including any departures from the present disclosure within known or customary practice in the art. The specification and embodiments are exemplary only. A true scope and spirit of the present disclosure are indicated by the appended claims.

It is to be understood that the present disclosure is not limited to the above-described structures in the accompanying drawings and may be subjected to various modifications and changes without departing from the scope. The scope of the present disclosure is only defined by the appended claims.

The invention claimed is:

1. A signal transmission circuit configured for testing an integrated circuit (IC), comprising:
    an input circuit, configured to generate a first test signal in response to a first control signal and a clock signal;
    a transfer chain, comprising multiple stages of serially-connected transfer circuits, wherein adjacent two stages of transfer circuits in the transfer chain are connected via a through silicon via (TSV) therebetween, a transfer circuit on one end of the transfer chain is connected to the input circuit, and the multiple stages of transfer circuits transfer the first test signal stage by stage in response to the clock signal;
    multiple signal output ports, wherein a first test signal input port of each stage of transfer circuit is correspondingly connected to one of the multiple signal output ports; and
    a mode selection circuit comprising:
        a first input port connected to the first test signal;
        a second input port connected to a second test signal;
        a control port connected to the first control signal;
        a first output port connected to the input port of the stage of transfer circuit and configured to transmit the first test signal to the input port of the stage of transfer circuit under a control of the first control signal; and
        a second output port connected to an output port of the stage of transfer circuit and configured to transmit the second test signal to the output port of the stage of transfer circuit under the control of the first control signal,
        wherein the first test signal and the second test signal are transmitted to an adjacent chip layer via a same TSV, and the second test signal is connected to the multiple signal output ports.

2. The signal transmission circuit according to claim 1, wherein the input circuit comprises:
    a first Flip-Flop, comprising an input pin connected to the first control signal and a clock pin connected to the clock signal; and
    an AND gate, comprising a first input pin connected to the first control signal, and a second input pin connected to an inverted output pin of the first Flip-Flop.

3. The signal transmission circuit according to claim 1, wherein the stage of transfer circuit comprises:
    a second Flip-Flop, comprising an input pin connected to the first test signal and a clock pin connected to the clock signal; and
    a third Flip-Flop, comprising an input pin connected to an output pin of the second Flip-Flop and a clock pin connected to the clock signal.

4. The signal transmission circuit according to claim 3, wherein
    the adjacent two stages of transfer circuits in the transfer chain are connected via the TSV,
    an output pin of the third Flip-Flop of one stage of transfer circuit is connected to a first end of the TSV, and
    the input pin of the second Flip-Flop of another stage of transfer circuit is connected to a second end of the TSV.

5. The signal transmission circuit according to claim 1, wherein
    the input circuit is disposed on a base chip layer of the IC, and
    the multiple stages of transfer circuits are respectively disposed in each chip layer of the IC.

6. The signal transmission circuit according to claim 5, further comprising:
    a first test TSV chain, comprising multiple serially-connected TSVs and configured to transmit the first control signal from a top chip layer to the base chip layer.

7. The signal transmission circuit according to claim 1, wherein the mode selection circuit comprises:
    a first switch, comprising a first pin connected to an output port of the input circuit, a second pin connected to the input port of the stage of transfer circuit, and a control pin connected to the first control signal; and
    a second switch, comprising a first pin connected to the second test signal, a second pin connected to the output port of the stage of transfer circuit, and a control pin connected to the first control signal.

8. The signal transmission circuit according to claim 7, wherein the first switch includes an N-type metal-oxide-semiconductor field effect transistor (MOSFET), and the second switch includes a P-type MOSFET.

9. The signal transmission circuit according to claim 1, wherein the mode selection circuit comprises:
    a first inverter, comprising an input pin connected to the first control signal;
    a second inverter, comprising an input pin connected to an output pin of the first inverter;
    a first switch, comprising a first pin connected to the first test signal, a second pin connected to the input port of the stage of transfer circuit, a first control pin connected to the output pin of the first inverter, and a second control pin connected to an output pin of the second inverter; and
    a second switch, comprising a first pin connected to the second test signal, a second pin connected to the output port of the stage of transfer circuit, a first control pin connected to the output pin of the second inverter, and a second control pin connected to the output pin of the first inverter,
    wherein the first switch and the second switch are complementary metal oxide semiconductor (CMOS) transmission gates.

10. The signal transmission circuit according to claim 1, wherein
    multiple stages of mode selection circuits are respectively disposed in each chip layer of the IC.

11. The signal transmission circuit according to claim 10, further comprising:
    a second test TSV chain, comprising multiple serially-connected TSVs, and configured to provide the first control signal for the multiple stages of mode selection circuits.

12. An integrated circuit (IC) testing method, configured for a signal transmission circuit, comprising:
    outputting, by an input circuit, a first test signal to an input port of a first stage of transfer circuit in a transfer chain in response to a first control signal and a clock signal, wherein the transfer chain comprises multiple stages of serially-connected transfer circuits, adjacent two stages of transfer circuits in the transfer chain are connected via a through silicon via (TSV) therebetween, and the first stage of transfer circuit is a transfer circuit on one end of the transfer chain connected to the input circuit;

sequentially transmitting, by the multiple stages of transfer circuits, the first test signal along the transfer chain in response to the clock signal;

when the first test signal is transmitted to an output port of a stage of transfer circuit, outputting, by a signal output port connected to an input port of the transfer circuit, the first test signal to a chip layer of the IC; and transmitting, by a mode selection circuit, the first test signal to the input port of the stage of transfer circuit under a control of the first control signal, or transmitting, by the mode selection circuit, a second test signal to the output port of the stage of transfer circuit under the control of the first control signal, wherein the second test signal is connected to each signal output port, the first test signal and the second test signal are transmitted to an adjacent chip layer via a same TSV, and the mode selection circuit comprises:

a first input port connected to the first test signal;

a second input port connected to the second test signal;

a control port connected to the first control signal;

a first output port connected to the input port of the stage of transfer circuit and configured to transmit the first test signal, and a second output port connected to an output port of the stage of transfer circuit and configured to transmit the second test signal.

13. The IC testing method according to claim 12, wherein outputting, by the input circuit, the first test signal to the input port of the first stage of transfer circuit in the transfer chain in response to the first control signal and the clock signal comprises:

outputting the first test signal to the input port of the first stage of transfer circuit in the transfer chain when the first control signal is high.

14. The IC testing method according to claim 12, wherein sequentially transmitting, by the multiple stages of transfer circuits, the first test signal along the transfer chain in response to the clock signal comprises:

transmitting the first test signal from a previous stage of transfer circuit to a current stage of transfer circuit according to the clock signal when the first control signal is high, wherein the first test signal at an output of the current stage of transfer circuit is delayed by at least one clock cycle from the first test signal at an output of the previous stage of transfer circuit.

15. The IC testing method according to claim 12, further comprising:

transmitting the second test signal to signal output ports at a plurality of chip layers in the IC when the first control signal is low.

16. The IC testing method according to claim 15, further comprising:

selectively outputting, by the mode selection circuit, the first test signal sequentially to the plurality of chip layers in the IC or the second test signal simultaneously to the plurality of chip layers in the IC, according to the first control signal.

17. The IC testing method according to claim 12, further comprising:

transmitting the first control signal from a top chip layer of the IC to a base chip layer of the IC by a first test TSV chain, wherein the first test TSV chain comprises multiple serially-connected TSVs.

18. The IC testing method according to claim 12, wherein the first test signal has a pulse width of one clock cycle.

19. An integrated circuit (IC), comprising a signal transmission circuit, wherein the signal transmission circuit comprises:

an input circuit, configured to generate a first test signal in response to a first control signal and a clock signal;

a transfer chain, comprising multiple stages of serially-connected transfer circuits, wherein adjacent two stages of transfer circuits in the transfer chain are connected via a through silicon via (TSV) therebetween, a transfer circuit on one end of the transfer chain is connected to the input circuit, and the multiple stages of transfer circuits transfer the first test signal stage by stage in response to the clock signal;

multiple signal output ports, wherein a first test signal input port of each stage of transfer circuit is correspondingly connected to one of the multiple signal output ports coupled to one of chip layers of the IC; and a mode selection circuit comprising:

a first input port connected to the first test signal;

a second input port connected to a second test signal;

a control port connected to the first control signal;

a first output port connected to the input port of the stage of transfer circuit and configured to transmit the first test signal to the input port of the stage of transfer circuit under a control of the first control signal; and a second output port connected to an output port of the stage of transfer circuit and configured to transmit the second test signal to the output port of the stage of transfer circuit under the control of the first control signal, wherein the first test signal and the second test signal are transmitted to an adjacent chip layer via a same TSV, and the second test signal is connected to the multiple signal output ports.

* * * * *